(12) United States Patent
Oehler et al.

(10) Patent No.: US 10,809,300 B2
(45) Date of Patent: Oct. 20, 2020

(54) METHOD AND ARRANGEMENT FOR CHECKING A CONTROL CIRCUIT OF AN INDUCTIVE LOAD

(71) Applicant: Continental Teves AG & Co. oHG, Frankfurt am Main (DE)

(72) Inventors: Peter Oehler, Frankfurt (DE); Frank Michel, Rosbach v. d. Höhe (DE)

(73) Assignee: CONTINENTAL TEVES AG & CO. OHG, Frankfurt am Main (DE)

( * ) Notice: Subject to any disclaimer, the term of this patent is extended or adjusted under 35 U.S.C. 154(b) by 0 days.

(21) Appl. No.: 16/339,425

(22) PCT Filed: Nov. 3, 2017

(86) PCT No.: PCT/EP2017/078139
§ 371 (c)(1),
(2) Date: Apr. 4, 2019

(87) PCT Pub. No.: WO2018/083215
PCT Pub. Date: May 11, 2018

(65) Prior Publication Data
US 2020/0041568 A1    Feb. 6, 2020

(30) Foreign Application Priority Data

Nov. 4, 2016 (DE) .......................... 10 2016 221 648

(51) Int. Cl.
*G01R 31/02* (2006.01)
*G01R 31/327* (2006.01)
(Continued)

(52) U.S. Cl.
CPC ....... *G01R 31/3278* (2013.01); *G01R 31/006* (2013.01); *G01R 31/2621* (2013.01); *G01R 31/327* (2013.01); *G01R 31/3277* (2013.01); *G01R 31/50* (2020.01); *G01R 31/72* (2020.01); *G01R 31/007* (2013.01); *G01R 31/3274* (2013.01)

(58) Field of Classification Search
CPC .............. G01R 31/3278; G01R 31/327; G01R 31/3277; G01R 31/50; G01R 31/72; G01R 31/006; G01R 31/007; G01R 31/3274
USPC ........................................ 324/340, 415, 418
See application file for complete search history.

(56) References Cited

U.S. PATENT DOCUMENTS 5,763,963 A    6/1998 Zydek et al.
7,027,939 B2   4/2006 Fey et al.
(Continued)

FOREIGN PATENT DOCUMENTS

DE    4434179 A1    3/1996
DE    10154763 A1   5/2003
(Continued)

OTHER PUBLICATIONS

German Search Report for German Application No. 10 2016 221 648.1, dated Jul. 4, 2017, with partial translation, 14 pages.
(Continued)

*Primary Examiner* — Raul J Rios Russo
(74) *Attorney, Agent, or Firm* — RatnerPrestia

(57) ABSTRACT

A method for checking a control circuit for an inductive load, wherein one or two currents are measured and evaluated. An arrangement for carrying out such a method is also disclosed.

16 Claims, 2 Drawing Sheets

(51) Int. Cl.
    *G01R 31/26*     (2020.01)
    *G01R 31/50*     (2020.01)
    *G01R 31/72*     (2020.01)
    *G01R 31/00*     (2006.01)

(56) References Cited

U.S. PATENT DOCUMENTS

| | | |
|---|---|---|
| 8,131,439 B2 | 3/2012 | Oehler et al. |
| 8,704,508 B2 | 4/2014 | Fey et al. |
| 2005/0017583 A1* | 1/2005 | Faggioli ............... H01F 7/1811 |
| | | 307/125 |
| 2010/0295539 A1* | 11/2010 | Kutzner .................. G01K 7/01 |
| | | 324/105 |
| 2015/0303805 A1 | 10/2015 | Franchini et al. |
| 2017/0012530 A1* | 1/2017 | Pasqualetto ............ G01R 31/50 |
| 2019/0277915 A1* | 9/2019 | Hartzsch ............... H02P 29/027 |

FOREIGN PATENT DOCUMENTS

| | | |
|---|---|---|
| DE | 102007001458 A1 | 9/2007 |
| WO | 2007131947 A1 | 11/2007 |

OTHER PUBLICATIONS

International Search Report and Written Opinion for International Application No. PCT/EP2017/078139, dated Feb. 5, 2018—10 pages.

\* cited by examiner

METHOD AND ARRANGEMENT FOR CHECKING A CONTROL CIRCUIT OF AN INDUCTIVE LOAD

CROSS REFERENCE TO RELATED APPLICATIONS

This application is the U.S. National Phase Application of PCT International Application No. PCT/EP2017/078139, filed Nov. 3, 2017, which claims priority to German Patent Application No. 10 2016 221 648.1, filed Nov. 4, 2016, the contents of such applications being incorporated by reference herein.

FIELD OF THE INVENTION

The invention relates to a method for checking a control circuit for an inductive load and to an arrangement having such a control circuit and an inductive load, wherein the arrangement is configured to execute such a method.

BACKGROUND OF THE INVENTION

FIG. 1 shows by way of example an inductive load 10 and an associated control circuit 15. The control circuit 15 is designed to supply current to the inductive load 10 in a defined manner.

In the present case, the inductive load 10 is designed as a coil. In this case, for example, said inductive load may be a coil of a relay. A current flowing through said coil is denoted by $I_{Coil}$.

The control circuit 15 has a recirculation transistor 20 and a driver transistor 30. The recirculation transistor 20 and the driver transistor 30 are connected to one another in series. An upper pole in relation to FIG. 1 or first pole of the recirculation transistor 20 is connected in this case to a supply connection REFx. A lower or second pole of the driver transistor 30 is connected to ground. The inductive load 10 is connected between the supply connection REFx and a potential between the recirculation transistor 20 and the driver transistor 30.

A supply voltage $V_{REFx}$ applied to the supply connection REFx defines a high potential, which can also be referred to as HSx. A potential between the two transistors 20, 30 is denoted by VOx.

A recirculation current $I_{Redun}$ flows through the recirculation transistor 20. A driver current $I_{Sense}$ flows through the driver transistor 30. The two currents $I_{Redun}$, $I_{Sense}$ can be measured in a manner not described in more detail since the two transistors 20, 30 are sense FETs or such sense FETs are connected in parallel with the transistors 20, 30.

The arrangement shown in FIG. 1 can be used, in particular, to actuate the inductive load 10 using pulse-width modulation.

A pulse-width-modulation period $T_{PWM}=1/f_{PWM}$ is typically prescribed for pulse-width-modulated actuation, wherein $f_{PWM}$ is a frequency. The pulse-width-modulation period can be divided into an on phase, which lasts for a time $t_{on}=$ Duty Cycle $\times T_{PWM}$. In this case, a duty factor referred to as duty cycle is also assumed. In this time, a rising coil current flows from the supply connection REFx through the inductive load 10 and the switched-on driver transistor 30 toward ground. Such an on phase then typically alternates with an off phase, which lasts for a time $t_{off}=(1-$Duty Cycle$)\times T_{PWM}$. In this time, a falling coil current flows through the inductive load 10 and the switched-on recirculation transistor 20.

The current measurement will be dealt with in more detail in the following text.

For example, point measurements can be carried out, that is to say, for example, at the driver transistor 30 at a time of $t_{on}/2$ and across the recirculation transistor 20 at a time of $t_{off}/2$.

The current can also be measured across the driver transistor 30 during the on phase and across the recirculation transistor 20 during the off phase, and it can be averaged accordingly. To this end, delta-sigma modulators can be used, for example.

The current measurement of $I_{Sense}$ can be carried out as already mentioned, for example, by means of a sense FET in parallel with the driver transistor 30. Said current measurement may be possible, for example, only during the on phase (during $t_{on}$). The current measurement of $I_{Redun}$ can be carried out as already mentioned, for example, by means of a sense FET in parallel with the recirculation transistor 20. Said current measurement may be possible, for example, only in the off or recirculation phase.

If the valve stage or the inductive load 10 is disconnected completely, then the recirculation transistor 20 can be disconnected; the recirculation current $I_{Redun}$ can then flow via a corresponding body diode. In this operating state, precise current measurement of $I_{Redun}$ is typically not possible. It is also expedient and common practice to reduce the coil current as rapidly as possible using a high clamping voltage. This can be carried out by means of Zener clamping across the driver transistor 30. Then no current flows through the recirculation transistor 20; the current measurement of $I_{Redun}$ is typically not possible.

As an alternative, the high clamping voltage can be effected by means of Zener clamping across a lower recirculation transistor, which is connected in series with the upper recirculation transistor 20 illustrated in FIG. 1. A current measurement of $I_{Redun}$ while the valve stage is completely disconnected is then typically only possible when the upper recirculation transistor 20 remains switched on here.

An actual current, which corresponds as well as possible to the coil current through the inductive load 10, is typically formed in any form from the two currents $I_{Sense}$ and $I_{Redun}$. To this end, for example, during point measurement, the actual current can be calculated as $I_{Sense}(@t_{on}/2)$, during averaging the actual current can be calculated as an average value ($I_{Sense}$ (averaged during $t_{on}$), $I_{Redun}$ (averaged during $t_{off}$)). The difference between a prescribed setpoint value and the actual current can be assigned to a PID controller or another controller whose output (duty cycle) actuates a pulse-width modulator, which then in turn performs the temporal actuation of the two transistors 20, 30 according to FIG. 1.

An active valve test pulse or a passive valve test pulse can be used to test the control circuit 15. In the case of an active valve test pulse, a current flows through the inductive load 10, but it does not cause any mechanical or hydraulic reaction. In the case of a passive valve test pulse, in contrast, no significant current flows through the inductive load 10. A number of external faults such as coil breakage, short circuit to ground or external power supply can be identified by means of such valve test pulses. It is also possible to check whether the driver transistor 30 can be switched at all.

The use of such active valve test pulses is common practice. In this case, a check is typically only carried out to determine whether the driver transistor 30 can be switched on. This can be seen, in particular, in that the marked voltage VOx already explained above falls below a lower threshold, which can be denoted, for example, by LTHx. A high-side voltage or quiescent voltage of the inductive load 10 typically remains unchanged at a high level here. Inductive loads or valve coils connected in parallel with the same high voltage or high side should typically not show a reaction. This can be seen, in particular, in that the low side or lower voltage of such coils or inductive loads remain above the threshold LTHx.

However, whether the recirculation transistor 20 can be switched remains unchecked in this case. Furthermore, a current measurement is not associated therewith.

The duration of an active valve test pulse is typically so short that an excessive current is not built up in the inductive load 10 and, as a result of the valve test pulse, in particular, there is no mechanical or hydraulic reaction of a valve of which a part may be the inductive load 10. A typical pulse duration is, for example, 50 μs to 200 μs. After a test pulse has ended, it is typically important that the coil current is reduced again as quickly as possible, which typically takes place at a high clamping voltage across the valve coil or the inductive load 10.

Over such a short duration, it is typically not possible to test the whole arrangement in a meaningful manner. To this end, namely a steady state would have to be produced, for which typically at least approximately six pulse-width-modulation (PWM) periods appear to be necessary. This is obvious at a PWM frequency of typically 4 kHz to 20 kHz, which corresponds to a PWM period of at least 50 μs.

The duration of the on phase $t_{on}$=pulse duration can be set or prescribed very precisely. In contrast, the duration of the current reduction (typically to 0 A) is very variable. Said duration essentially depends on a value $I_{Peak}$, the clamping voltage and the valve coil or the inductive load 10 or the magnetic circuit. $I_{Peak}$ in this case denotes the maximum current intensity through the inductive load 10 reached. This value typically increases as $V_{REFx}$ increases, as the coil resistance $R_{coil}$ of the inductive load 10 decreases and as the temperature decreases.

Both of the above-mentioned principal methods for current measurement are typically not practicable while the inductive load 10 is completely switched off, or else during (in particular active) valve test pulses.

SUMMARY OF THE INVENTION

An aspect of the invention is a method for checking a control circuit for an inductive load that is executed in an alternative, for example better, way in comparison with methods known from the prior art. Another aspect of the invention is an arrangement having a control circuit and an inductive load, wherein the arrangement is configured to execute a method according to an aspect of the invention.

According to an aspect of the invention, this is achieved by a method as claimed in claim 1, a method as claimed in claim 3, and an arrangement as claimed in claim 15. Advantageous configurations can be taken from the respective dependent claims, for example. The content of the claims is incorporated in the content of the description by express reference.

An aspect of the invention relates to a method for checking a control circuit for an inductive load.

The control circuit has a recirculation transistor and a driver transistor. A first pole of the recirculation transistor and a first pole of the inductive load are connected to a supply voltage. A second pole of the recirculation transistor and a second pole of the inductive load are connected to a first pole of the driver transistor. A second pole of the driver transistor is connected to a potential that is different from the supply voltage, in particular ground.

The method comprises the following steps:
switching on the driver transistor for a checking period,
measuring a first current flowing through the driver transistor at a first measurement time, wherein the first measurement time is before an end of the checking period,
switching on the recirculation transistor,
measuring a second current flowing through the recirculation transistor at a second measurement time when the recirculation transistor is switched on, and
identifying a fault state based on a deviation between the first current and the second current.

By means of the method according to an aspect of the invention, comparison of the first current and the second current makes it possible to identify in a simple manner whether a fault state exists. Consequently, it is possible to identify various faults that cannot be identified in methods according to the prior art.

The method is based, in particular, on the knowledge that the first current and the second current should be of the same magnitude or should differ by a defined or known value typically within certain limits during normal function.

In accordance with the prior art, it is possible, in particular, to identify faults in the driver transistor as well as some external faults. In accordance with an aspect of the invention, in particular, faults of the recirculation transistor, in current measurement systems and in parts of pulse-width-modulation logic can also be identified. Furthermore, further external faults can be identified. Internal faults may be, for example, faults of a power FET, in current measurement systems, in PID controllers or in the pulse-width-modulation logic generally.

Many such signals also have an effect on current measurement systems. External faults may be, in particular, faults of the valve coil or the inductive load along with connections themselves.

Overall, the method according to an aspect of the invention therefore makes it possible to significantly improve the identification of faults outside of the pulse-width-modulation current control.

In accordance with a preferred embodiment, the fault state is identified precisely when the first current and the second current differ in absolute terms and/or in relative terms by more than a predetermined value. In this case, for example, absolute current values or else relative deviations can be prescribed, up to which a difference between the first current and the second current is not considered to be a fault. In contrast, in the case of exceeding, a fault state is identified.

An aspect of the invention furthermore relates to a method for checking a control circuit for an inductive load.

The control circuit has a recirculation transistor and a driver transistor. A first pole of the recirculation transistor and a first pole of the inductive load are connected to a supply voltage.

A second pole of the recirculation transistor and a second pole of the inductive load are connected to a first pole of the driver transistor. A second pole of the driver transistor is connected to a potential that is different from the supply voltage, in particular ground.

The method comprises the following steps:
switching on the driver transistor for a checking period,
switching on the recirculation transistor at the end of the checking period,
measuring a first current flowing through the driver transistor at a first measurement time, wherein the first measurement time is before an end of the checking period, and/or measuring a second current flowing through the recirculation transistor at a second measurement time when the recirculation transistor is switched on, and identifying a fault state based on a deviation between the first current and a first setpoint value and/or based on a deviation between the second current and a second setpoint value.

In the embodiment just described, it is assumed that a setpoint value for the first current and the second current can be calculated or is known in some other way. The first setpoint value and/or the second setpoint value can in this case be calculated, in particular, using a temperature and/or a supply voltage of the inductive load. If the corresponding current deviates from the setpoint value by more than a determined value, for example a prescribed absolute and/or relative value, this likewise indicates a fault.

It should be mentioned that switching on the recirculation transistor at least for the measurement described here is not absolutely necessary when only the first current but not the second current is used. The step of switching on the recirculation transistor can therefore be omitted in particular in this case.

The checking period preferably has a duration of 10 μs to 200 μs. The first measurement time is preferably 0 μs to 10 μs before an end of the checking period. The second measurement time is preferably 1 μs to 10 μs after the end of the checking period. Such values have been proven in practice.

The recirculation transistor is preferably switched off immediately after the second measurement time. Consequently, the recirculation current is prevented from flowing further through the recirculation transistor, which typically means that the current is quickly converted to heat after switch-off owing to the high impedance of the recirculation transistor.

The recirculation transistor typically remains switched off over the checking period.

In accordance with a preferred embodiment, the driver transistor is switched off immediately after the checking period. This ensures that the current flows only still through the recirculation transistor and no longer through the driver transistor after the checking period.

The step of switching on the recirculation transistor is preferably executed immediately after the end of the checking period. Consequently, an immediate transition between the flow of current through the driver transistor and the flow of current through the recirculation transistor is achieved so that no or only very little current is lost in the meantime.

In accordance with one development, a value indicating the current is recorded and stored for the purpose of measurement at the first measurement time. A value indicating the second current can also be recorded and stored for the purpose of measurement at the second measurement time. A value indicating the first current may be, in particular, a first voltage. The value indicating the second current may be, in particular, a second voltage. By storing such a value, it is possible, in particular, to obtain more time for a measurement, which can accordingly be carried out in a more precise manner.

A voltage can be stored, in particular, by means of a sample-and-hold circuit.

The value indicating the first current is preferably measured by means of an analog-to-digital converter or by means of a delta-sigma modulator. Likewise, the value indicating the second current is preferably measured by means of an analog-to-digital converter or by means of a delta-sigma modulator. Such embodiments have been found to be advantageous in practice.

The first current is preferably measured by means of a sense FET connected in parallel with the driver transistor. Likewise, the second current is preferably measured by means of a sense FET connected in parallel with the recirculation transistor. Such sense FETs are advantageously used for current measurement. However, it should be understood that other types of current measurement system can also be used in principle, for example by means of a shunt resistor.

An aspect of the invention furthermore relates to an arrangement having a control circuit and an inductive load, wherein the arrangement is configured to execute a method according to an aspect of the invention. In respect of the method according to an aspect of the invention, reference can be made to all of the embodiments and variants described herein.

An aspect of the invention furthermore relates to a non-volatile, computer-readable storage medium on which program code is stored, during the execution of which a processor carries out a method according to an aspect of the invention. In respect of the method according to an aspect of the invention, reference can also be made here to all of the embodiments and variants described herein.

It can be said, for example, that, at the end of an on phase or checking period, the present current $I_{Sense}$ can be "frozen" and either measured by means of an accurate analog-to-digital converter or can be sampled often, for example, 256 times or another number of times, and specifically in particular by means of a delta-sigma modulator, in order to obtain, for example, an 8-bit value.

At the beginning of an off phase or an end of the valve test pulse actuation, the recirculation transistor can, for example, initially be made to carry out a transient process, in particular at a low clamping voltage across the inductive load or the coil. In this case, a duration of 6 μs or 4 μs to 8 μs can be used, for example. The present current $I_{Redun}$ can then be "frozen", and there can be an immediate change to a high clamping voltage in order to rapidly reduce the current. Measurement can be carried out simultaneously or thereafter, for example, by means of an accurate analog-to-digital converter, or, for example, 256-time sampling can be carried out, and specifically, in particular, by means of a delta-sigma modulator, in order to obtain, for example, an 8-bit value. The hardware is preferably designed or modified including actuation logic so that the main functionality of a pulse-width-modulation valve stage can already be checked in advance—that is to say before a "real" current control process or before an active brake intervention, which can occur, for example, in the case of ABS control—by means of a conventional software monitoring system. Said check of the main functionality typically essentially comprises determining whether the two power FETS can be switched and whether the two associated current measurement systems are functioning in a fault-free manner.

To this end, the actuation of the two current measurement systems can be modified in such a way that the active valve test pulse can be used therefor, wherein both the switching of the recirculation transistor (indirectly) and the two current measurement systems can be checked.

The maximum current $I_{Peak}$ building up over the pulse duration of the active valve test pulse is typically heavily dependent on the following factors:

resistance $R_{DSon}$ of the driver transistor,
resistance $R_{Coil}$ of the inductive load,
supply voltage $V_{REFx}$, temperature of the driver transistor, temperature of the inductive load (in particular across the resistors thereof).

The maximum current $I_{Peak}$ can therefore typically be checked in absolute terms only relatively approximately since, in particular, the temperatures are usually not known to a sufficient degree of accuracy.

The current $I_{Sense}$ at the end of the pulse duration is typically equal to or similar to the current $I_{Peak}$, measured across the path of the driver transistor. The current $I_{Redun}$ at the beginning of the disconnection is typically equal to or approximately equal to the current $I_{Peak}$, measured across the recirculation path. Said currents can be compared with one another in a fairly precise manner relative to one another.

It is therefore possible to implement, in particular, two fault monitoring processes, in particular software fault monitoring processes:

$I_{Sense}/I_{Redun}$ comparison, in particular in the case of relatively low currents, wherein the equation $I_{Sense}=I_{Redun}$ (or else, as a modification, a similarity of the values in specific limits) relative to one another is independent of $V_{REFx}$, $R_{Coil}$, $R_{DSon}$, temperature and the inductive load or valve coil, approximate setpoint/actual value comparison, wherein the current $I_{Sense}$ and/or the current $I_{Redun}$ are compared with an estimated value $I_{Peak}$.

The more accurately the dependencies are known, in particular the dependencies on the temperatures, the more accurately a calculation of $I_{Peak}$ is possible and the narrower the fault thresholds can be conceived.

Such an approximate monitoring identifies, for example, faults of the valve coil such as winding short-circuits, a greatly increased coil resistance or a bypass of the coil.

As an alternative to the methods for current measurement described further above, it is also possible to measure the coil current by means of a voltage measurement across a resistor in series with the coil. In this case, a point measurement or an averaging current measurement can be used, for example. Since there is no redundant current measurement, in this case only the approximate setpoint/actual value comparison is typically available.

BRIEF DESCRIPTION OF THE DRAWINGS

Further features and advantages will be gathered by a person skilled in the art from the exemplary embodiment described below with reference to the appended drawing, in which.

DETAILED DESCRIPTION OF THE PREFERRED EMBODIMENTS

Figure 1:
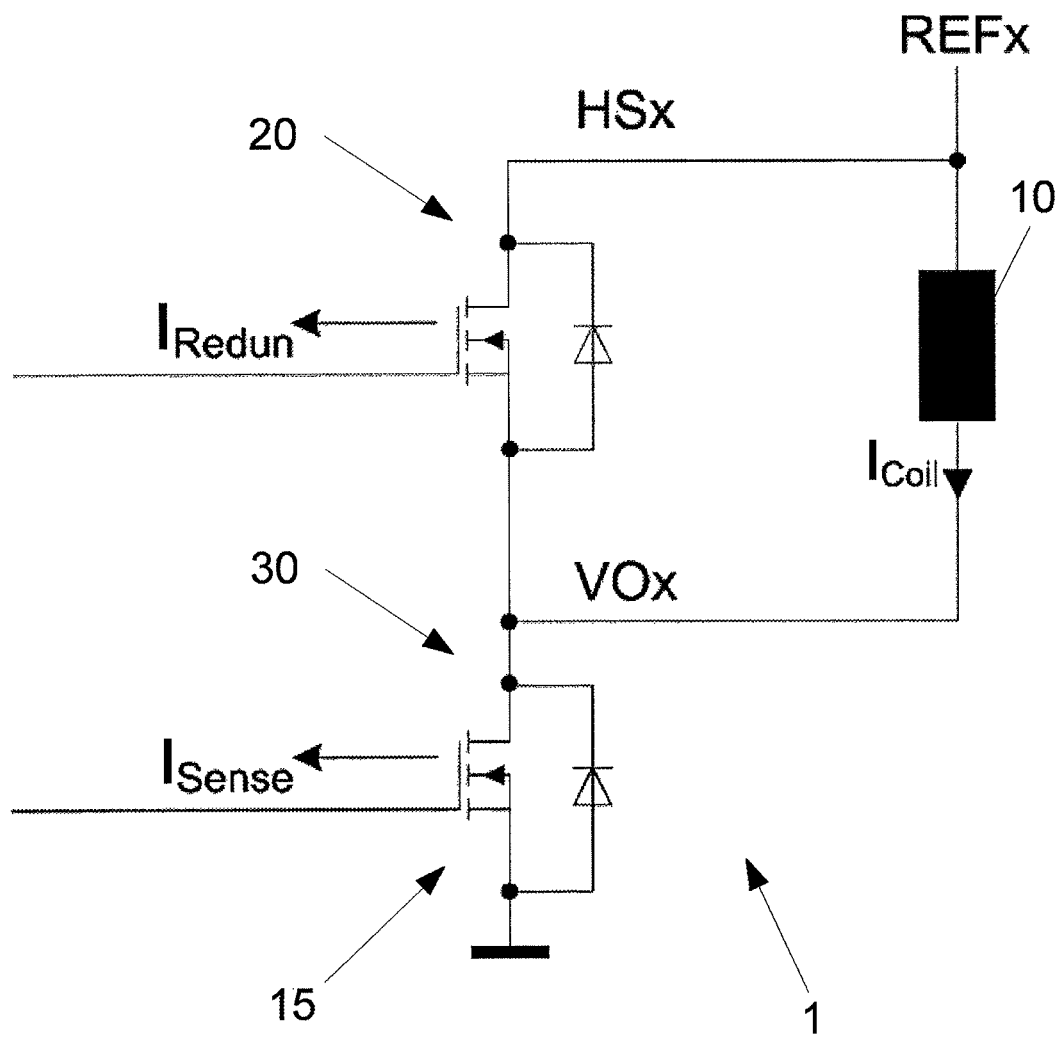
FIG. 1: shows an arrangement according to an aspect of the invention for carrying out a method according to an aspect of the invention.

FIG. 1 shows an arrangement 1 for carrying out the method according to an aspect of the invention, wherein the arrangement 1 is embodied in accordance with an exemplary embodiment of an aspect of the invention. Consequently, a method can be carried out in accordance with an exemplary embodiment of an aspect of the invention.

The arrangement 1 has an inductive load 10, which is embodied in the present case as a coil of a relay or of a valve. In addition, the arrangement 1 has a recirculation transistor 20 and a driver transistor 30.

The components of the arrangement shown in FIG. 1 have already been described at the beginning. Repetition is omitted here; instead, reference is made to the explanations made above. The above statements, in particular statements written at the beginning before the naming of the aspects of the invention, are made through express reference to the content of said description of the figures. Said statements are fully included in the content of the disclosure of this application.

A method according to an aspect of the invention can be carried out in accordance with an exemplary embodiment by means of the arrangement 1 shown in FIG. 1. To this end, first of all the driver transistor 30 is switched on during a checking period. As a result thereof, a certain current flows through the inductive load 10. Said current rises continuously over the checking period.

Said current is measured shortly before the end of the checking period, as a result of which a first current is obtained.

Immediately at the end of the checking period, the driver transistor 30 is switched off and the recirculation transistor 20 is switched on simultaneously. The current, which is maintained by the inductive load 10, thus no longer flows through the driver transistor 30 toward ground, but instead now flows in the loop, and specifically through the recirculation transistor 20.

After waiting for a transient phenomenon, the current flowing through the recirculation transistor 20 is measured, as a result of which a second current is obtained.

The first current and the second current should be of the same magnitude within certain limits. If this is the case, this indicates that no fault state exists. However, if this is not the case, this indicates a fault state.

Such a procedure can be used to check, in particular, an anti-lock braking system of a vehicle without actually involving a control intervention. This is based on the consideration that, in anti-lock braking systems, typically very long periods elapse between control interventions since most braking processes occur without control intervention. This would lead to a situation in which, without separate checking, an intermittently arising fault state would be identified possibly only in the case of a control intervention, that is to say in a critical driving situation of a motor vehicle.

By means of the method according to an aspect of the invention, many faults can be advantageously determined by way of a simple check, without this having any effects on the vehicle.

It should furthermore be understood that the embodiment of FIG. 1 can be embodied, in particular, even without the shown diodes, which bypass the transistors 20, 30.

Figure 2:
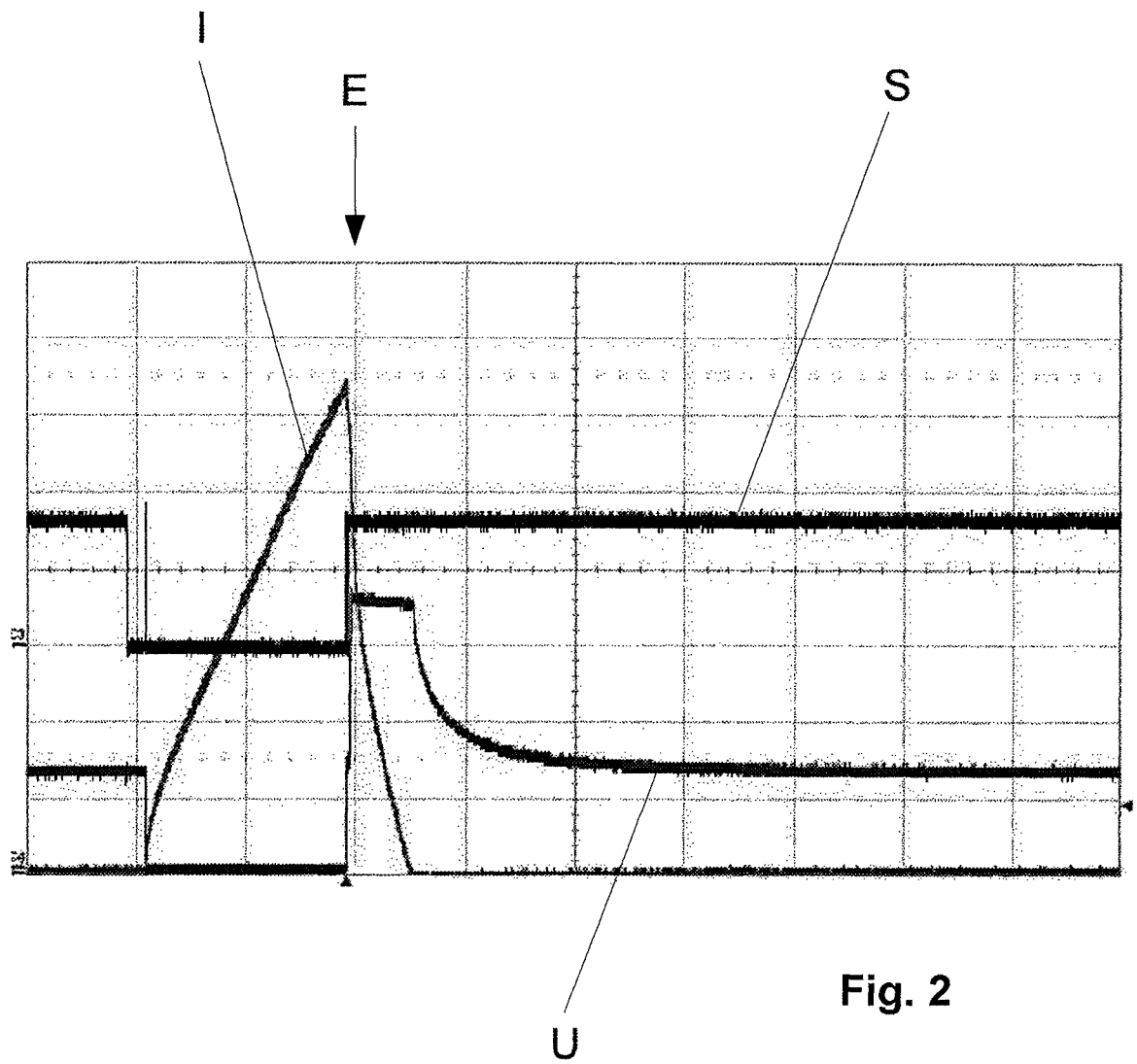
FIG. 2: shows profiles of voltages and a current.

FIG. 2 shows a typical time profile of various values, wherein a time axis is plotted on the horizontal axis.

The curve denoted by I shows the current that initially flows through the driver transistor 30 toward ground, while it rises, and falls again at the end of the checking period denoted by the letter E. The measurements of the first current and the second current take place immediately before and after the end of the checking period.

In order to realize the checking period, the driver transistor 30 is actuated accordingly. A corresponding measured actuation signal is denoted by the letter S.

The curve denoted by U shows the voltage dropped across the driver transistor 30. Over the checking period, said voltage is virtually zero, but rises again briefly afterwards and then falls again.

Mentioned steps of the method according to an aspect of the invention can be executed in the indicated order. However, they can also be executed in a different order. In one of its embodiments, for example with a specific combination of steps, the method according to an aspect of the invention can be executed in such a way that no further steps are executed. However, in principle, further steps can also be executed, even steps of a kind which have not been mentioned.

The claims that are part of the application do not represent any dispensing with the attainment of further protection.

If it turns out in the course of the proceedings that a feature or a group of features is not absolutely necessary, then the applicant aspires right now to a wording for at least one independent claim that no longer has the feature or the group of features. This may be, by way of example, a subcombination of a claim present on the filing date or may be a subcombination of a claim present on the filing date that is limited by further features. Claims or combinations of features of this kind requiring rewording can be understood to be covered by the disclosure of this application as well.

It should further be pointed out that configurations, features and variants of aspects of the invention that are described in the various embodiments or exemplary embodiments and/or shown in the figures can be combined with one another in any way. Single or multiple features can be interchanged with one another in any way. Combinations of features arising therefrom can be understood to be covered by the disclosure of this application as well.

Back-references in dependent claims are not intended to be understood as dispensing with the attainment of independent substantive protection for the features of the back-referenced subclaims. These features can also be combined with other features in any way.

Features that are disclosed only in the description or features that are disclosed in the description or in a claim only in conjunction with other features may fundamentally be of independent significance essential to aspects of the invention. They can therefore also be individually included in claims for the purpose of distinction from the prior art.

The invention claimed is:

1. A method for checking a control circuit for an inductive load, the control circuit comprising a recirculation transistor and a driver transistor, a first pole of the recirculation transistor and a first pole of the inductive load are connected to a supply voltage, a second pole of the recirculation transistor and a second pole of the inductive load are connected to a first pole of the driver transistor, and a second pole of the driver transistor is connected to a potential that is different from the supply voltage, in particular ground, the method comprising:
   switching on the driver transistor for a checking period;
   measuring a first current flowing through the driver transistor at a first measurement time, the first measurement time is before an end of the checking period;
   switching on the recirculation transistor;
   measuring a second current flowing through the recirculation transistor at a second measurement time when the recirculation transistor is switched on; and
   identifying a fault state based on a deviation between the first current and the second current,
   wherein the checking period has a duration of 10 µs to 200 µs.

2. The method as claimed in claim 1,
   wherein the fault state is identified precisely when the first current and the second current differ in absolute terms and/or in relative terms by more than a predetermined value.

3. The method as claimed in claim 1, wherein the first measurement time is 0 µs to 10 µs before an end of the checking period.

4. The method as claimed in claim 1, wherein the second measurement time is 1 µs to 10 µs after the end of the checking period.

5. The method as claimed in claim 1, wherein the recirculation transistor is switched off immediately after the second measurement time.

6. The method as claimed in claim 1, wherein the driver transistor is switched off immediately after the checking period.

7. The method as claimed in claim 1, wherein the step of switching on the recirculation transistor takes place immediately after the end of the checking period.

8. The method as claimed in claim 1, wherein a value indicating the first current is recorded and stored for the purpose of measurement at the first measurement time;
   and/or
   wherein a value indicating the second current is recorded and stored for the purpose of measurement at the second measurement time.

9. The method as claimed in claim 8, wherein a value indicating the first current is a first voltage;
   and/or
   wherein a value indicating the second current is a second voltage.

10. The method as claimed in claim 8, wherein the value indicating the first current is measured by an analog-to-digital converter or by a delta-sigma modulator;
    and/or
    wherein the value indicating the second current is measured by an analog-to-digital converter or by a delta-sigma modulator.

11. The method as claimed in claim 1, wherein the first current is measured by a sense FET connected in parallel with the driver transistor,
    and/or
    wherein the second current is measured by a sense FET connected in parallel with the recirculation transistor.

12. An arrangement having a control circuit and an inductive load, wherein the arrangement is configured to execute a method as claimed in claim 1.

13. The method as claimed in claim 9, wherein the value indicating the first current is measured by an analog-to-digital converter or by a delta-sigma modulator; and/or wherein the value indicating the second current is measured by an analog-to-digital converter or by a delta-sigma modulator.

14. A method for checking a control circuit for an inductive load, the control circuit comprising a recirculation transistor and a driver transistor, a first pole of the recirculation transistor and a first pole of the inductive load are connected to a supply voltage, a second pole of the recirculation transistor and a second pole of the inductive load are connected to a first pole of the driver transistor, and a second pole of the driver transistor is connected to a potential that is different from the supply voltage, in particular ground, the method comprising:
   switching on the driver transistor for a checking period;
   switching on the recirculation transistor at the end of the checking period;
   measuring a first current flowing through the driver transistor at a first measurement time, the first measurement time is before an end of the checking period, and/or measuring a second current flowing through the recirculation transistor at a second measurement time when the recirculation transistor is switched on; and identifying a fault state based on a deviation between the first current and a first setpoint value and/or based on a deviation between the second current and a second setpoint value, wherein the checking period has a duration of 10 µs to 200 µs.

15. The method as claimed in claim 14, wherein the first setpoint value and/or the second setpoint value is calculated using a temperature and/or a supply voltage of the inductive load.

16. An arrangement having a control circuit and an inductive load, wherein the arrangement is configured to execute a method as claimed in claim 14.

* * * * *